United States Patent
Ghosh et al.

(10) Patent No.: US 6,308,294 B1
(45) Date of Patent: Oct. 23, 2001

(54) ADAPTIVE HYBRID ARQ USING TURBO CODE STRUCTURE

(75) Inventors: Amitava Ghosh, Vernon Hills; Brian K. Classon, Streamwood; Mark C. Cudak, McHenry; Louay Jalloul, Palatine, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/603,426

(22) Filed: Jun. 26, 2000

Related U.S. Application Data

(60) Provisional application No. 60/166,078, filed on Nov. 17, 1999.

(51) Int. Cl.[7] .................. H03M 13/29; H03M 13/35; H04L 1/18
(52) U.S. Cl. ..................................... 714/751; 714/774
(58) Field of Search ..................... 714/751, 774

(56) References Cited

U.S. PATENT DOCUMENTS 5,978,365 * 11/1999 Yi ........................... 370/331
5,983,384 * 11/1999 Ross .......................... 714/755

OTHER PUBLICATIONS

Shu Lin and Daniel J. Costello, *Error Control Coding: Fundamentals and Applications*, Prentice Hall, 1983, pg 477–494.

David Chase, "Code Combining—A Maximum–Likelihood Decoding Approach for Combining an Arbitrary Number of Noisy Packets," *IEEE Trans. Commun. Technol.*, vol. COM–33, No. 5, May 1985.

(List continued on next page.)

*Primary Examiner*—Stephen M. Baker
(74) *Attorney, Agent, or Firm*—Sayed Beladi; Steven A. May

(57) ABSTRACT

A generic structure of Hybrid ARQ using Turbo Codes is provided which requires the function of a) channel coding, b) redundancy selection, c) buffering and max-ratio diversity combining, d) channel decoding, e) error detection and f) sending back an acknowledgement to the transmitter. The functions (a) and (b) are performed at the transmitter while functions (c) to (f) are performed at the receiver. The initial code rate can be explicitly communicated to the receiver or blindly detected.

19 Claims, 4 Drawing Sheets

OTHER PUBLICATIONS

Anwarul Hasan, Vijay K. Bhargava, Tho Le–Ngoc, "Algorithms and Architectures for the Design of a VLSI ReedSolomon Codec," *Reed–Solomon Codes and Their Applications*, IEEE Press, 1994.

Joachim Hagenauer, "Rate–Compatible Punctured Convolutional Codes (RCPC Codes) and their Applications," *IEEE Transactions on Communications*, vol. 36, No. 4, Apr. 1998.

Samir Kallel, "Generalized Type II Hybrid ARQ Scheme Using Punctured Convolutional Coding," *IEEE Transactions on Communications*, vol. 38, No. 11, Nov. 1990.

Douglas N. Rowitch and Laurence B. Milstein, "Rate Compatible Punctured Turbo (RCPT) Codes in a Hybrid FEC/ARQ System," ICC 1997.

Samir Kallel, "Complementary Punctured Convolution (CPC) Codes and Their Applications," *IEEE Transactions on Communications*, vol. 43, No. 6, Jun. 1995.

Siemans AG, "Comparison of Hybrid ARQ Types I and II–II for TDD", Contribution to No. TSGR1#3(99)177to the $3^{rd}$Generation Partnership (3GPP), Nynashamn, Sweden, Mar. 1999.

Xiaoxin, Justin Chuang, Kapil Chawla and Jim Whitehead, "Performance Comparison of Link Adaptation and Incremental Redundancy in Wireless Data Networks," Wireless Communications and Networking Conference, New Orleans, Sep. 21–24, 1999.

Dimitri Bertsekas, Robert Gallager, *Data Networks Second Edition*, Prentice–Hall, 1992, p. 64–85.

Samir Kallel, "Efficient Hybrid ARQ Protocols with Adaptive Forward Error Correction," *IEEE Transactions on Communications*, vol. 42, No. 2/3/4, Feb./Mar. Apr. 1994.

Siemans, AG, "ARQ error control techniques", Contribution to No. TSGR1#3(99)178 to the $3^{rd}$ Generation Partnership Program (3GPP), Nynashamn, Sweden, Mar. 1999.

C. Berrou et. al, "Near Shannon limit error–correcting coding and decoding:turbo codes," Proc. ICC'93, pp. 1064–1070. D. Chase, IEEE Trans. Commun., 1985.

C. Chan and E. Geraniotis, "An adaptive hybrid FEC/ARQ protocol using turbo codes," 1997 IEEE International Conference on Universal Personal Communications Record, 1997, pp. 541–545.

K. Narayanan, "A novel ARQ technique using the turbo coding principle," IEEE Commun. Ltrs, p. 49–51, Mar. 1997.

* cited by examiner

BLOCK DIAGRAM OF A TURBO ENCODER USING TWO R=1/2 CONSTITUENT CODES

GENERIC BLOCK DIAGRAM OF ADPATIVE HYBRID ARQ

EXAMPLE FLOWCHART OF
THE PROPOSED METHOD

| INITIAL RATE | TRANSMISSION BLOCKS | TRANSMISSION SEQUENCE | EFFECTIVE DECODER RATE AFTER EACH TRANSMISSION |
|---|---|---|---|
| 1 | $B_1=X$<br>$B_2=1/2$ OF $Y_1$ AND $1/2$ OF $Y_2$ $(Y_{11},Y_{22},...)$<br>$B_3=$OTHER $1/2$ OF $Y_1$ AND OTHER $1/2$ OF $Y_2$ $(Y_{12},Y_{22},...)$<br>$B_4=X'$ | $B_1,B_2,B_3,B_4,B_2,B_3,B_1...$ | $1,1/2,1/3,1/4,1/4,1/4...$ |
| 1 | $B_1=X$<br>$B_2=1/2$ OF $Y_1$ AND $1/2$ OF $Y_2$ $(Y_{11},Y_{22},...)$<br>$B_3=$OTHER $1/2$ OF $Y_1$ AND OTHER $1/2$ OF $Y_2$ $(Y_{12},Y_{22},...)$<br>$B_4=X'$ | $B_1,B_2,B_3,B_4,B_1,B_2...$ | $1,1/2,1/3,1/4,1/4,1/4...$ |
| 1/2 | $B_1=X+1/2$ OF $Y_1$ AND $1/2$ OF $Y_2$ $(X_1,Y_{11},Y_{22},...)$<br>$B_2=X'+$OTHER $1/2$ OF $Y_1$ AND OTHER $1/2$ OF $Y_2$ $(X'_1,Y_{12},Y_{21},...)$ | $B_1,B_2,B_1,B_2,B_1,B_2...$ | $1/2,1/4,1/4,1/4...$ |
| 1/3 | $B_1=X+Y_1+Y_2$<br>$(X_1,Y_{11},Y_{21},...)$<br>$B_2=X'+Y_1+Y_2$<br>$(X'_1,Y_{12},Y_{22},...)$ | $B_1,B_2,B_1,B_2,B_1,B_2...$ | $1/3,1/4,1/4,1/4...$ |
| 3/4 | $B_1=X+1/6$ OF $Y_1$ AND $1/6$ OF $Y_2$ $(X_1,Y_{11},Y_{21},X_2,Y_{16},Y_{26}...)$<br>$B_2=4/6$ OF $Y_1$ AND $4/6$ OF $Y_2$ $(Y_{12},Y_{22},Y_{13},Y_{23},Y_{14},Y_{24},Y_{15},Y_{25}...)$<br>$B_3=X'+1/6$ OF $Y_1$ AND $1/6$ OF $Y_2$ $(X'_1,Y_{17},Y_{27},X'_2,Y_{113},Y_{213}...)$ | $B_1,B_2,B_3,B_1,B_2,B_3...$ | $3/4,3/4,3/4,1/4,1/4...$ |

*FIG.4*

ADAPTIVE HYBRID ARQ USING TURBO CODE STRUCTURE

This application claim benefit to provisional application Ser. No. 60/166,078 filed Nov. 17, 1999.

FIELD OF THE INVENTION

The present invention relates generally to communication systems and in particular, to adaptive hybrid ARQ using turbo code structure.

BACKGROUND OF THE INVENTION

Adaptive Modulation and Coding (AMC) gives the flexibility to match the modulation and forward error correction (FEC) coding scheme to the average channel conditions for each user. AMC promises a large increase in average data rate for users that have a favorable channel quality due to their proximity to the base site or other geographical advantage. Enhanced GSM systems using AMC offer data rates as high as 384 kbps compared 100 kbps without AMC. Likewise, 1.25 MHz CDMA systems can offer peak data rates as high as 5 Mbps through AMC, where 460 kbps was typical without AMC. AMC, however, does have a few drawbacks. AMC is sensitive to measurement error and delay. In order to select the appropriate modulation, the scheduler must be aware of the channel quality. Errors in the channel estimate will cause the scheduler to select the wrong data rate and either transmit at too high a power, wasting system capacity, or too low a power, raising the block error rate. Delay in reporting channel measurements also reduces the reliability of the channel quality estimate due to constantly varying mobile channel.

To overcome measurement delay, the frequency of the channel measurement reports may be increased, however, the measurement reports consume system capacity that otherwise might be used to carry data.

For these reasons, AMC is often used to provide a coarse data rate selection, perhaps based on a sub-optimum channel estimate as compared to a set of independent thresholds. Automatic Repeat request (ARQ) can be used in conjunction with AMC to ensure data delivery by requesting retransmissions of erroneously received blocks. The retransmission request can be ACK or NACK based. AMC is improved with ARQ because it can automatically adapt to instantaneous channel conditions. The combined AMC (or FEC) and ARQ design process-is very complex, involving FEC performance in the channel of interest as well as delay and implementation complexity constraints. Using FEC+ARQ together is known as a type I hybrid ARQ.

Even greater throughputs or error performance can be achieved with type II hybrid ARQ. This scheme, designated Hybrid ARQ in the remainder, is similar to standard ARQ in that it repeats all blocks that have been received in error. However, Hybrid ARQ improves on standard ARQ methods by saving and using failed transmission blocks at the receiver to increase the coding gain. The failed transmission blocks are jointly decoded with the current block in order to improve performance. The blocks that are sent by the transmitter are considered part of a larger code. Because additional parts of this code are sent only in response to the instantaneous channel conditions, Hybrid ARQ is also correctly known as Incremental Redundancy or Adaptive Hybrid ARQ.

There are several different flavors of Hybrid ARQ. The simplest flavor is code combining (also known as Chase combining), which simply repeats the first block for each transmission. The joint decoder is a block repetition decoder can be implemented as a block combiner, which can look like an equal gain combiner or max-ratio combiner, followed by a single block decoder. Because code combining is in effect a repetition coding scheme, it is correctly classified as a type II hybrid ARQ. Advantages of Chase combining compared to other Hybrid ARQ methods include smaller decoder complexity, smaller memory requirements, the ability to self-decode every block before joint decoding, and not having to specify maximum number of transmission attempts.

However, Hybrid ARQ methods that provide more sophisticated coding methods over the blocks than the simple block repetition code may offer larger coding gains. Hybrid ARQ schemes can be designed such that the first L blocks form part of a larger code. Construction techniques are available for many types of codes, including Reed-Solomon codes, convolutional codes, and turbo codes The L code blocks may also be partially overlapping, with some symbol positions repeated in more than one block. These positions can be treated with a symbol combiner similar to the block combiner. After L transmissions, the blocks are repeated, with the old blocks either combined with or replaced by the new blocks.

A self-decodable block is one that may be decoded by itself before joint decoding. Obviously, the first of the L blocks is always self-decodable. If the first block is severely damaged in transmission, it is advantageous to have the other blocks self-decodable as well. The term type III hybrid ARQ was used in S. Kallel, "Complementary punctured convolutional codes and their applications," IEEE Trans. Commun., June 1995, to refer to the class of Hybrid ARQ protocols in which all blocks are self-decodable. Since, as stated in Siemens AG TSGR1 #3(99)177, Mar. 22–26, 1999 types II and III are "minor variants of the same scheme", no special designation is required. However, the use of the designation emphasizes the fact that either only the first block or all L blocks are self-decodable, and that the self-decodable schemes require special care to construct.

Hybrid ARQ improvements can greatly increase user throughputs, potentially doubling system capacity. In effect, Hybrid ARQ adapts to the channel by sending additional increments of redundancy, which increases the coding rate and effectively lowers the data rate to match the channel. Hybrid ARQ does not rely only on channel estimates but also relies on the errors signaled by the ARQ protocol. Hybrid ARQ is even more difficult to design than FEC+ARQ, because of additional control, code construction, and decoder implementation issues. In addition, Hybrid ARQ also complicate the ARQ protocol implementation.

Turbo codes, which provide error correction gains close to the theoretical Shannon limit, can be used in conjunction with hybrid ARQ. Several prior art approaches exist, including code combining, punctured turbo codes and a priori methods. These methods, however, do not make the best possible use of the turbo code structure in fading channels. These methods do also not handle combining adaptive coding and modulation with hybrid ARQ.

Prior-art ARQs do not make the best use of the turbo code structure in fading channels. Additionally, retransmissions are the same size as the original transmission and the throughput cost for a second transmission is significant. Prior-art ARQs not have provisions for self-decodable blocks other than the first block, without having all the blocks self-decodable and the self-decodable blocks must be at least the same size as the information packet.

Thus, there is a need for a turbo hybrid ARQ that does not suffer from these limitations of the prior art. The invention provides a turbo hybrid ARQ that contains self-decodable blocks other than the first block, allows retransmissions of different sizes, and is better on fading channels.

BRIEF DESCRIPTION OF THE DRAWINGS

FIG. 4 an example of the transmission blocks used in the scheme along with the block transmission sequence for various selected initial turbo code rate.

DETAILED DESCRIPTION OF THE DRAWINGS

Figure 1:
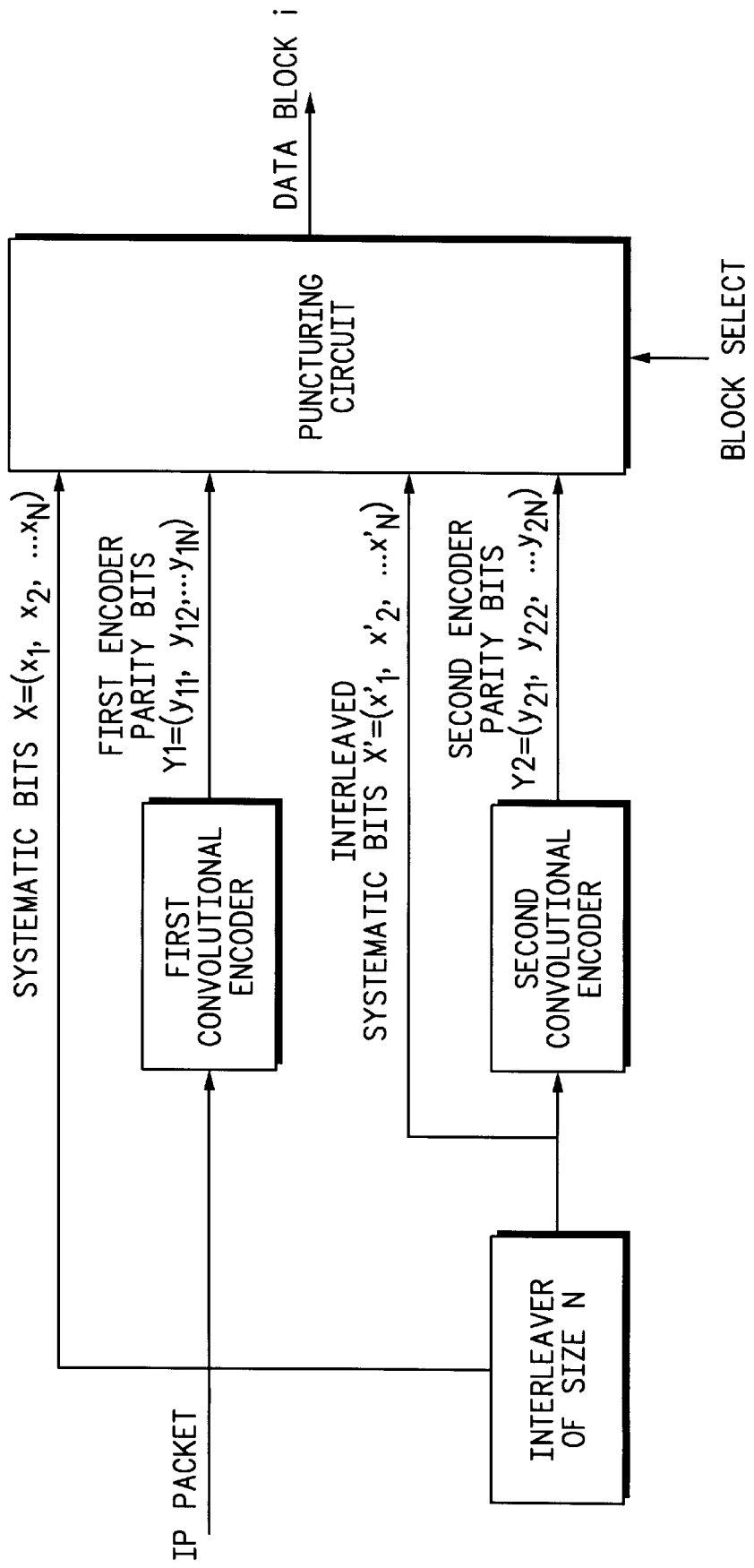
FIG. 1 is a block diagram of a turbo encoder in accordance with the preferred embodiment of the present invention.

The Turbo codes used in the proposed hybrid ARQ system consists of a parallel concatenation of two convolutional encoders as shown in FIG. 1. In a preferred embodiment, the encoders are identical $R=\frac{1}{2}$ systematic and recursive convolutional encoders. The overall code rate of the turbo code entering the puncturing circuit for the preferred embodiment is $\frac{1}{4}$. For an input stream, four output streams are formed: the input stream x itself, a parity stream produced by the first convolutional code $y_1$, interleaved input stream x' and the second parity stream $Y_2$ produced by the second convolutional code. The puncturing block after the encoder is used to form (for example) $R=\frac{3}{4}$, $R=\frac{2}{3}$ and $R=\frac{1}{2}$ codes by puncturing the parity bits. As an example, for $R=\frac{1}{2}$ codes alternate parity bits are sent over the channel ($x_1$, $y_{11}$, $X_2$, $Y_{21}$, $X_3$, $Y_{12}$, ... $X_N$, $Y_{1N}$ where N is the size of Turbo interleaver) In case of $R=\frac{1}{3}$ code the interleaved systematic bits (x') are not sent over the channel.

Figure 2:
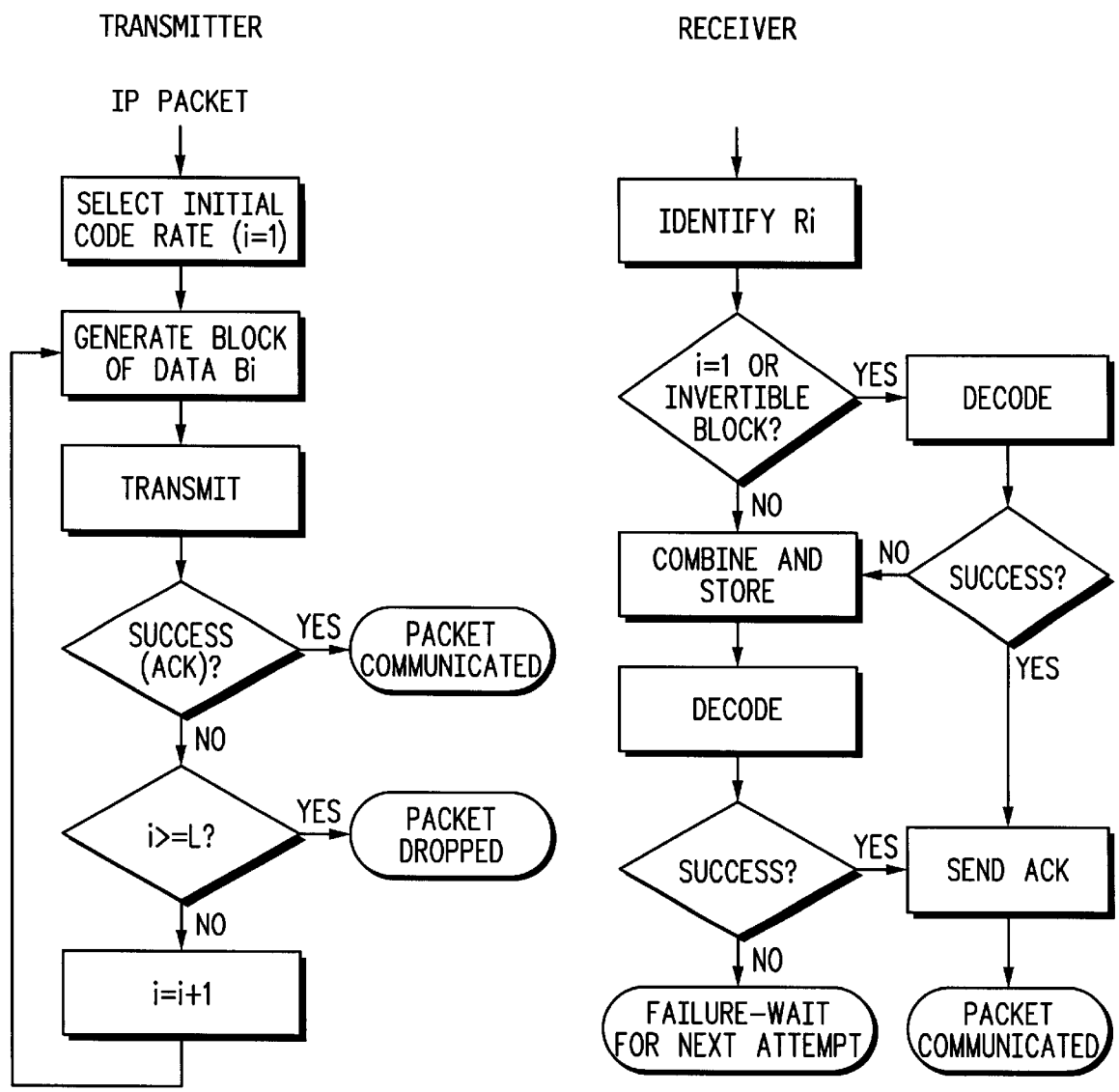
FIG. 2 is a flow chart showing adaptive hybrid ARQ in accordance with the preferred embodiment of the present invention.

The proposed method is described below with the flowchart shown in FIGS. 2 and 3. FIG. 2, shows the generic structure of Hybrid ARQ using Turbo Codes which requires the function of a) channel coding, b) redundancy selection, c) buffering and max-ratio diversity combining, d) channel decoding, e) error detection and f) sending back an acknowledgement to the transmitter. As illustrated in FIG. 2, the functions (a) and (b) are performed at the transmitter while functions (c) to (f) are performed at the receiver. The initial code rate can be explicitly communicated to the receiver or blindly detected. FIG. 4 shows an example of the transmission blocks used in the scheme along with the block transmission sequence for various selected initial turbo code rate.

Figure 3:
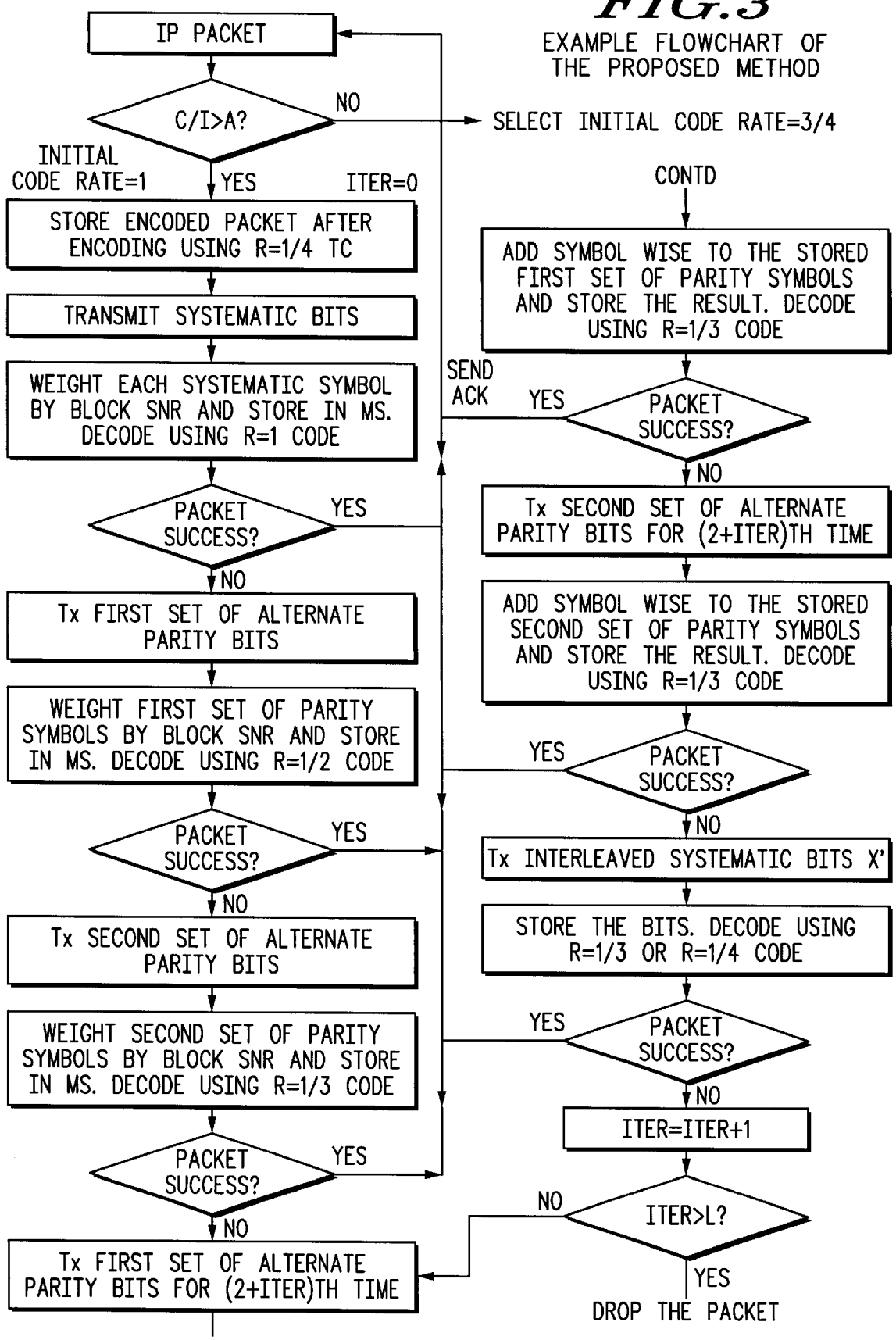
FIG. 3 is a flow chart showing adaptive hybrid ARQ in accordance with the preferred embodiment of the present invention.

Finally, FIG. 3 shows a specific example of the proposed scheme with initial code rate chosen as 1.

1. The initial coding rate for hybrid ARQ is first chosen. The rate can be detected at the receiver using blind rate detection or explicit rate detection.
   If C/I>A initial Turbo code rate =1 where A is some preset threshold
   Otherwise initial Turbo code rate =$\frac{3}{4}$ (or $\frac{1}{2}$ if below another threshold B)
2. Assuming the initial code rate =1, the following steps are performed
3. Encode entire packet using rate $R=\frac{1}{4}$ Turbo Code
4. Transmit systematic bits only
5. Decode systematic bits ($X_1$, $X_2$, ... $X_N$) using hard decision
   if Packet Success, then done (send ACK)
   else weight each channel symbol by block SNR and store
6. Transmit the first set of alternating parity bits ($Y_{11}$, $Y_{22}$, ..., $Y_{2N}$)
7. Decode using $R=\frac{1}{2}$ Turbo Code
   if Packet Success, then done (send ACK)
   else weight each channel symbol by block SNR and store
8. Transmit the second set of alternating parity bits ($Y_{12}$, $Y_{21}$, ..., $Y_{2N}$)
9. Decode using $R=\frac{1}{3}$ code
   if Packet Success, then done (send ACK)
   else weight each channel symbol by block SNR and store
10. Transmit the first set of alternating parity bits for the second time ($Y_{11}$, $Y_{22}$, ..., $Y_{2N}$)
11. Add symbol-wise to the stored first set of alternating parity bits
    decode the result using a rate $\frac{1}{3}$ code
    if Packet Success, then done (send ACK)
    else store the weighted combined block
12. Transmit the second set of alternating parity bits for the second time ($Y_{12}$, $Y_{21}$, ..., $Y_{2N}$)
13. Add symbol-wise to the second set of alternating parity bits
    decode the result using a rate $\frac{1}{3}$ code
    if Packet Success, then done (send ACK)
    else store the weighted combined block
14. Transmit interleaved systematic bits (x')
15. Decode the result using $R=\frac{1}{4}$ code
    if Packet Success, then done (send ACK)
    else store the weighted block
16. Transmit the first set of alternating parity bits for the third time and so on
17. Iterate steps 9 to 16 X times.
    If Packet Success send ACK
    Otherwise drop the packet It may be noted that at step (15) one could either use weighted systematic bits combined with the previous block of systematic bits and decode it as a $R=\frac{1}{3}$ code or can use the interleaved systematic bits and decode it as a $R=\frac{1}{4}$ code. The exact decoding method can be predetermined or communicated to the receiver during call set up or using in-band signaling.

What is claimed is:

1. A method for transmitting data packets, the method comprising the steps of:
   receiving an incoming data packet;
   determining an initial turbo code rate based on a channel condition;
   turbo encoding the data packet to produce encoded bits comprising a plurality of systematic bits and a plurality of parity bits;
   transmitting a first portion of the encoded bits based on the initial turbo code rate;
   determining if an acknowledgment has been received for the transmitted first portion; and
   based on the acknowledgment and the initial turbo code rate, transmitting a second portion of the encoded bits.

2. The method of claim 1 where the second portion of encoded bits is smaller than the first portion of encoded bits.

3. The method of claim 1 where the a plurality of systematic and a plurality of parity bits are stored.

4. The method of claim 1 where the channel condition used to determine the initial turbo code rate is a carrier-to-interference ratio.

5. The method of claim 1 where the channel conditions used to determine the initial turbo code rate are determined by the transmitter.

6. The method of claim 1 where the channel conditions used to determine the initial turbo code rate are reported by the receiver.

7. The method of claim 1 where the initial turbo code rate is N/M, with N=1,2,3. . . , M=1,2,3. . . , and N<=M.

8. The method of claim 1 further comprising the steps of:
determine if a second acknowledgment has been received for the transmitted second portion; and
based on the second acknowledgment being received, transmitting a third portion of the encoded bits.

9. The method of claim 8 further comprising the steps of:
determining if a third acknowledgment has been received for the transmitted third portion; and
based on the third acknowledgment being received, transmitting a fourth portion of the encoded bits.

10. The method of claim 1 wherein the step of transmitting the first portion of the encoded bits comprises the step of transmitting systematic encoded bits.

11. The method of claim 1 wherein the step of transmitting the first portion of the encoded bits comprises the step of transmitting systematic encoded bits and a portion of the parity bits.

12. The method of claim 1 where a subsequent portion of the encoded bits, but not all subsequent portions of the encoded bits, are self-decodable.

13. The method of claim 12 wherein the subsequent portion of the encoded bits includes interleaved systematic encoded bits.

14. The method of claim 12 wherein the subsequent portion of the encoded bits includes interleaved systematic encoded bits and a portion of the parity bits.

15. A method for receiving data packets, the method comprising the steps of:
receiving a portion of an encoded data packet;
determining the content of information and parity symbols in the received portion based on an initial code rate for a first received portion of the encoded data packet;
self-decoding the received portion;
determining whether the self-decoding successfully decoded the received portion;
when the self-decoding of the received portion is not successful, combining the received portion of the encoded data packet with a previously combined portion of the encoded data packet to produce a new combined portion;
storing the new combined portion;
joint turbo decoding the new combined portion to produce decoded bits; and
acknowledging if no error is present in the decoded bits.

16. The method of claim 15 where the received portion of the encoded data packet is weighted with a block signal to noise ratio (SNR) before combining.

17. The method of claim 15 where the combining step comprises symbol combining interleaved systematic symbols with systematic symbols.

18. The method of claim 15 where the combining step comprises symbol combining overlapping symbols and concatenating non-overlapping symbols of the received portion of the encoded packet with the previous combined portion.

19. The method of claim 15 where the combining step comprises replacing systematic symbols with interleaved systematic symbols.

* * * * *